United States Patent
Rudolph et al.

(10) Patent No.: US 7,091,100 B2
(45) Date of Patent: Aug. 15, 2006

(54) POLYSILICON BIPOLAR TRANSISTOR AND METHOD OF MANUFACTURING IT

(75) Inventors: Uwe Rudolph, Dresden (DE); Martin Seck, München (DE); Armin Tilke, Dresden (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/916,774

(22) Filed: Aug. 12, 2004

(65) Prior Publication Data
US 2005/0106829 A1    May 19, 2005

Related U.S. Application Data

(63) Continuation of application No. PCT/EP03/00673, filed on Jan. 23, 2003.

(30) Foreign Application Priority Data
Feb. 12, 2002 (DE) ................. 102 05 712

(51) Int. Cl.
*H01L 21/331* (2006.01)
(52) U.S. Cl. ............... 438/358; 438/370; 257/588; 257/592; 257/E29.044; 257/E29.124

(58) Field of Classification Search ........... 438/348, 438/366, 368, 370, 545, 554
See application file for complete search history.

(56) References Cited

U.S. PATENT DOCUMENTS

| | | | | |
|---|---|---|---|---|
| 5,010,026 A | * | 4/1991 | Gomi | 438/363 |
| 5,144,403 A | * | 9/1992 | Chiang et al. | 257/514 |
| 5,479,047 A | | 12/1995 | Liao et al. | |
| 6,403,437 B1 | * | 6/2002 | Chantre et al. | 438/313 |
| 6,440,810 B1 | | 8/2002 | Johansson et al. | |
| 2001/0051413 A1 | | 12/2001 | Chantre et al. | |

FOREIGN PATENT DOCUMENTS

| | | |
|---|---|---|
| FR | 2 805 924 | 9/2001 |
| WO | WO 98/57367 A1 | 12/1998 |
| WO | WO 01/39264 A1 | 5/2001 |

* cited by examiner

*Primary Examiner*—Trung Dang
(74) *Attorney, Agent, or Firm*—Maginot Moore & Beck

(57) ABSTRACT

In the inventive method of producing a base terminal structure for a bipolar transistor, an etch stop layer is applied on a single-crystal semiconductor substrate, a poly-crystal base terminal layer is produced on the etch stop layer and an emitter window is etched in the base terminal layer using the etch stop layer as an etch stop.

20 Claims, 3 Drawing Sheets

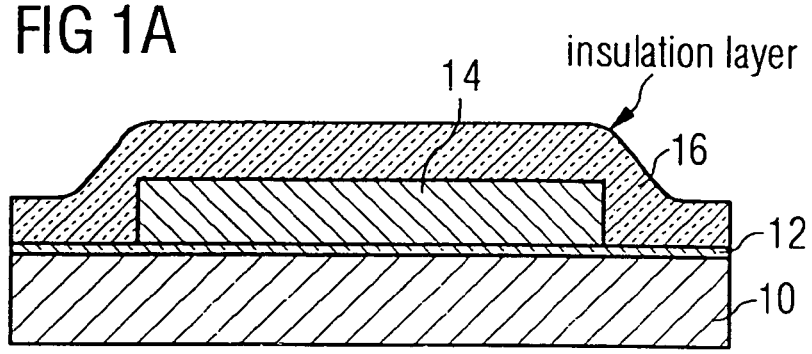
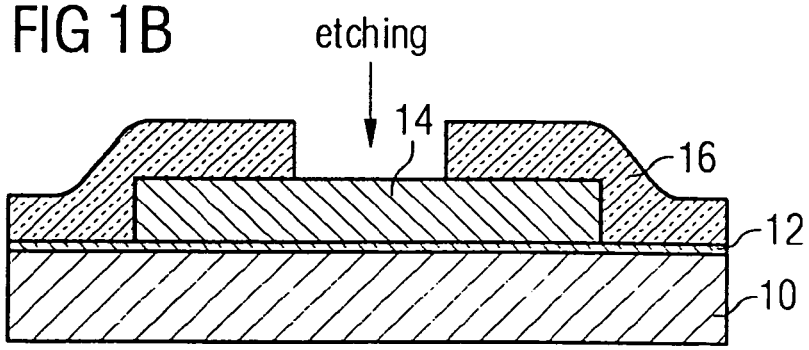
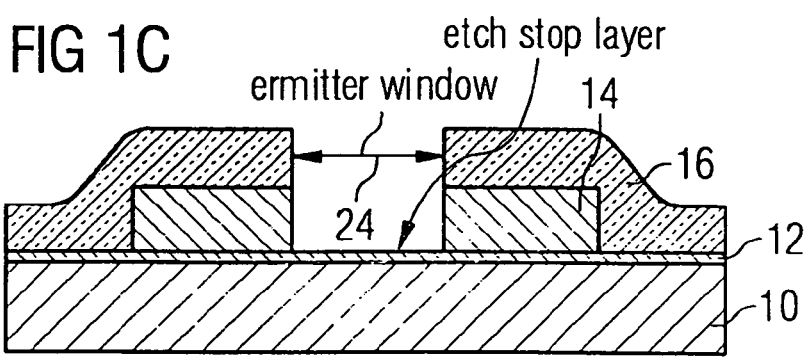
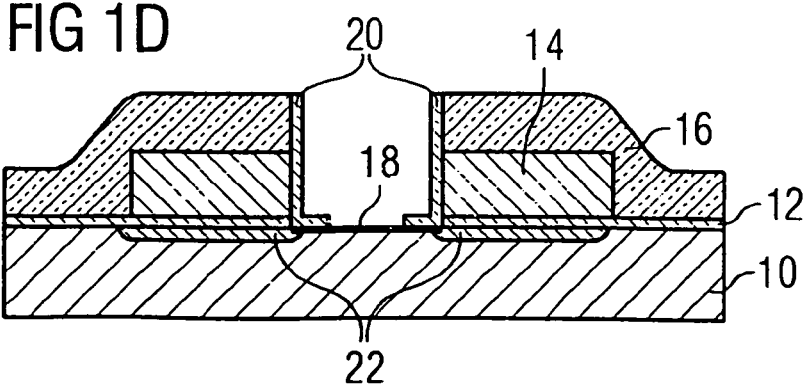

POLYSILICON BIPOLAR TRANSISTOR AND METHOD OF MANUFACTURING IT

CROSS-REFERENCE TO RELATED APPLICATION

This application is a continuation of copending International Application No. PCT/EP03/00673, filed Jan. 23, 2003, which designated the United States and was not published in English, and is incorporated herein by reference in its entirety.

BACKGROUND OF THE INVENTION

1. Field of the Invention

The present invention relates to semiconductor elements and the manufacture of them and, in particular, to polysilicon bipolar transistors having an improved base terminal architecture, and the manufacture of them.

2. Description of the Related Art

Modern integrated bipolar circuits are characterized by high switching speed, high transit frequencies, good driver features, high transconductance of the transistors and high stability of the control voltage. Due to these features, bipolar technology has a high importance in micro-electronics. With present conventional manufacturing processes of integrated bipolar circuits, a processing of data rates of more than 10 Gbits/sec can, for example, be achieved at present, wherein bipolar transistors having an implanted base with transit frequencies of 30 GHz can be realized using the polysilicon emitter and base technology.

The base terminal structure is, among other things, decisive for good electrical features of polysilicon bipolar transistors. In a base terminal structure of a conventional polysilicon bipolar transistor, as is exemplarily illustrated in FIG. 3, a polysilicon layer 32 which is, after being patterned, effective as the base terminal region is generally applied on a single-crystal silicon substrate 30 in which the collector region is formed. An insulation layer 34, such as, e.g., silicon oxide, is applied over the polysilicon layer 32. A so-called emitter window 38 is usually formed in double polysilicon bipolar transistors having an implanted base region 36, wherein this emitter window 38 is provided to form, on the one hand, the active emitter region of the bipolar transistor in the silicon substrate 30 and, on the other hand, the emitter terminal for this region. The emitter window 38 is thus formed by etching through the insulation layer 34 and subsequently through the polysilicon material 32 serving as the base terminal region. Since the polysilicon material 32 of the base terminal region is directly on top of the single-crystal silicon substrate 30, the etching process cannot be stopped abruptly on the single-crystal silicon substrate 30 due to the lacking etching selectivity between the poly-crystal silicon material 32 and the single-crystal semiconductor material of the silicon substrate 30.

For this reason, a considerable substrate etching in an order of magnitude of about 40 nm is provided in the region of the emitter window 38 due to the resulting layer thickness variations of the polysilicon and insulation layers to be etched and due to etching rate differences over the silicon wafer, to etch, definitely on each silicon wafer and everywhere on the different silicon wafers to be processed, through the poly-crystal base terminal layer. The active base region 36 of the bipolar transistor, which subsequently will be referred to as the "intrinsic" base region, is implanted in the silicon substrate 30 in the region of the emitter window 38. Subsequently, an inner spacer 40 having a suitable width is applied or patterned in the emitter window 38. The inner spacer 40 thus has the task to define, on the one hand, the emitter region of the bipolar transistor and the region of the emitter terminal and to provide, on the other hand, an electrical insulation of the emitter terminal region from the base terminal region.

The base terminal, i.e. the electrical connection between the implanted "intrinsic" base region 36 and the base terminal layer 32 of a polysilicon material which, in general, is highly doped, is obtained by out-diffusing dopant atoms from the highly doped polysilicon material of the base terminal layer 32 into the silicon substrate 30. This doped region obtained by an out-diffusion of dopant atoms from the polysilicon material of the base terminal layer 32 into the silicon substrate 30 will subsequently be referred to as the "extrinsic" base terminal region 42.

Before the lateral out-diffusion of the extrinsic base terminal region 42 in the direction of the intrinsic base region 36, due to the required substrate etching, first of all diffusion in the depth of the substrate material 30 must take place to produce an electrical connection via the extrinsic base terminal region 42 between the base terminal layer 32 and the intrinsic base region 36 of the bipolar transistor.

In the manufacturing method known in the prior art, an in-diffusion of the doping atoms of at least 150 nm in depth, i.e. into the silicon substrate 30, is required since in the process of diffusion, the substrate etching of about 40 nm and the spacer length of about 100–150 nm, including the etching rate variations in the etching depth must be overcome to obtain the required diffusion depth. The base anneal process thus has to be performed at a relatively high temperature of about 1050° C.–1100° C.

Thus, a relatively high temperature budget (1050° C.–1100° C.) and thus a relatively high exposure to temperature for the semiconductor structure are required for this out-diffusion process, wherein additionally the terminal, i.e. the electrical connection, of the extrinsic base terminal region 42 to the intrinsic base region 36 can only be controlled relatively poorly. This leads to a relatively poor reproducibility of the electrical features of the semiconductor substrate, i.e. in particular of the base structure, of a conventional polysilicon bipolar transistor. Spurious scatterings of the values of the base terminal resistance of conventional polysilicon bipolar transistors can, for example, be the result.

As has been described above, the emitter window 38 of a polysilicon bipolar transistor having an implanted base is, for example, etched by means of fixed-time etching through the polysilicon material of the base terminal layer 32, wherein additionally etching into the single-crystal silicon substrate 30 takes place by means of suitably selected over-etching. Another possibility to pattern the emitter window 38 of a polysilicon bipolar transistor having an implanted base is to provide an endpoint detection of the etching process and suitably selected over-etching into the single-crystal silicon substrate 30. In both cases mentioned above, it is required for compensating layer thickness variations and etching rate differences over the silicon wafer to clearly etch the silicon substrate 30 considerably. This etching can, however, result in roughnesses in the substrate material, which as a result can, in an extreme case, cause an inhomogeneous interface in the emitter or an inhomogeneous base width and thus an inhomogeneous current distribution in the bipolar transistor.

Thus, important characteristic numbers, such as, e.g., the product of cutoff frequency $f_T$ and breakdown voltage $U_{CE0}$ or the product of current amplification and early voltage, may deteriorate.

These problems occurring in the prior art when manufacturing polysilicon bipolar transistors having implanted bases, up to now, must be minimized by means of very complicated control measures when etching the emitter window.

In addition, it has been required when manufacturing polysilicon bipolar transistors to in-diffuse a relatively deep extrinsic base terminal region into the single-crystal silicon substrate due to the required etching of the silicon substrate and the resulting lower lying base region in the silicon substrate starting from the highly doped polysilicon material of the base terminal layer, wherein this is, for example, performed by a temperature process. In order to be able to out-diffuse the dopant, such as, e.g., boron, phosphorus or arsenic etc., sufficiently deep from the polysilicon material of the base terminal layer into the single-crystal silicon substrate, a relatively high temperature budget is required and thus a relatively high exposure to temperature of the semiconductor element cannot be avoided when manufacturing it. This is, however, very problematic, in particular in modern BiCMOS technology.

By etching the silicon material of the substrate region required in the prior art and due to the problems connected thereto when electrically connecting the polysilicon base terminal layer to the intrinsic base region, the result can be spurious scatterings of the values of the base terminal resistance of conventional polysilicon bipolar transistors. In addition, the electrical characteristics of bipolar transistors mentioned above, such as, e.g., the cutoff frequency, breakdown voltage, current amplification and early voltage thereof, are influenced negatively by the resulting roughness of the etched silicon substrate.

SUMMARY OF THE INVENTION

It is the object of the present invention to provide an improved concept for manufacturing a semiconductor structure, in particular a base terminal structure for a polysilicon bipolar transistor, and a polysilicon bipolar transistor.

In accordance with a first aspect, the present invention provides a method of producing a base terminal structure for a bipolar transistor, having the following steps: applying an etch stop layer on a single-crystal semiconductor substrate; producing a poly-crystal base terminal layer on the etch stop layer; etching an emitter window in the base terminal layer using the etch stop layer as an etch stop; and producing a doped base terminal region by out-diffusing dopant atoms from the poly-crystal base terminal layer through the etch stop layer into the semiconductor substrate, wherein the base terminal region has a depth between 70 nm and 130 nm and preferably between 90 nm and 110 nm, and wherein the etch stop layer provides an electrically conductive connection between the doped base terminal region and the base terminal layer.

In accordance with a second aspect, the present invention provides a base terminal structure for a bipolar transistor, having: a doped base terminal region in a single-crystal semiconductor substrate, wherein the base terminal region has a depth between 70 nm and 130 nm and preferably between 90 nm and 110 nm; and a doped poly-crystal base terminal layer arranged on the doped base terminal region, wherein between the doped base terminal region and the base terminal layer, an intermediate layer is arranged which provides an electrically conductive connection between the doped base terminal region and the base terminal layer and is made of a material which can be used as an etch stop for etching the base terminal layer.

In accordance with a third aspect, the present invention provides a bipolar transistor having a base terminal structure having: a doped base terminal region in a single-crystal semiconductor substrate, wherein the base terminal region has a depth between 70 nm and 130 nm and preferably between 90 nm and 110 nm; and a doped poly-crystal base terminal layer arranged on the doped base terminal region, wherein between the doped base terminal region and the base terminal layer, an intermediate layer is arranged which provides an electrically conductive connection between the doped base terminal region and the base terminal layer and is made of a material which can be used as an etch stop for etching the base terminal layer.

In accordance with a fourth aspect, the present invention provides method of producing a semiconductor structure, having the following steps: applying an etch stop layer on a surface of a semiconductor substrate; producing a doped poly-crystal layer on the etch stop layer; etching the poly-crystal layer for producing a window in it, wherein the etch stop layer serves as an etch stop; and producing doped regions in the semiconductor substrate by out-diffusing dopant atoms from the remaining poly-crystal layer through the etch stop layer into the semiconductor substrate, wherein the doped region has a depth between 70 nm and 130 nm and preferably between 90 nm and 110 nm, and wherein the etch stop layer provides an electrically conductive connection between the doped regions in the semiconductor substrate and the remaining poly-crystal layer.

The present invention is based on the finding that when manufacturing a polysilicon bipolar transistor, i.e. in particular when manufacturing the base terminal structure of it, the spurious and disadvantageous etching of the silicon substrate material, as has been required in the prior art, can be avoided by providing a thin etch stop layer on the single-crystal silicon substrate when manufacturing the polysilicon bipolar transistor. When this etch stop layer, such as, e.g., a silicon oxide layer, is selected to be adequately thin, the dopants, such as, e.g. boron, phosphorus or arsenic, can, during the temperature treatment (tempering), further diffuse from the doped polysilicon material of the base terminal layer without being influenced significantly through this layer into the silicon substrate material and instantly form the extrinsic base terminal region in a lateral direction. Thus, a connection to the intrinsic base region of the bipolar transistor is formed. In addition, the annealing of the implanted base region already described can be performed at the same time in this temperature treatment.

In the inventive manufacturing method, a considerably smaller temperature budget and thus a considerably smaller exposure to temperature are sufficient to out-diffuse the extrinsic base terminal region during the manufacturing process of the polysilicon bipolar transistor and thus to produce the electrical connection between the base terminal layer and the intrinsic base region of the bipolar transistor. In this context, it is to be mentioned that an ever smaller exposure to temperature, in particular in modern BiCMOS processes, represents an ever more important requirement to the manufacturing process. BiCMOS technologies are a combination of bipolar and CMOS technologies. Thus, the advantages of bipolar and CMOS switching techniques can be united in an integrated circuit.

By the inventive provision of a thin etch stop layer on the single-crystal silicon substrate when manufacturing a polysilicon bipolar transistor, it can be achieved advantageously that the transistor geometry obtained can be reproduced very well and that the spurious and disadvantageous scattering of the values of the base line resistance is thus reduced.

By the inventive provision of a thin etch stop layer, etching the silicon substrate material can be avoided with both fixed-time etching and etching with endpoint detection. This is achieved by providing a very high selectivity between the polysilicon material of the base terminal layer and the material of the etch stop layer, such as, e.g. silicon oxide, when etching the emitter window of the bipolar transistor in such a way. Thus, a very small lateral out-diffusion of dopant atoms, e.g. boron, from the polysilicon material of the base terminal layer into the single-crystal silicon substrate is sufficient, i.e. the required penetration depth of the dopant atoms into the silicon substrate is decreased considerably so that, in particular in modern BiCMOS technologies, the exposure to temperature for the semiconductor element can be lowered significantly when manufacturing it. This is of particular advantage since modern CMOS processes only allow a very small exposure to temperature during the manufacturing process.

In addition, the scattering of the base terminal resistance is reduced or minimized, wherein the base terminal resistance, despite the decreased temperature budget when manufacturing the lateral, in-diffused extrinsic base terminal region and the resulting low out-diffusion of the dopants can be kept low. A low base terminal resistance results from a sufficient overlapping in the edge region of the intrinsic base region with the in-diffused extrinsic base terminal region, wherein this overlapping of both regions forms by a so-called lateral under-diffusion of the extrinsic base terminal region below the intrinsic base region.

Negative influences caused by the roughness of the etched silicon substrate material thus are cancelled by inventively providing a thin etch stop layer, so that spurious substrate roughnesses which, in the extreme case, may result in an inhomogeneous interface in the emitter region or an inhomogeneous base width and thus an inhomogeneous current distribution in the bipolar transistor are essentially avoided.

In summary, it can be noted that in the present invention a thin etch stop layer is provided between the single-crystal silicon substrate material and the polysilicon base terminal layer, wherein the etch stop layer thus, on the one hand, makes possible the usage of an extremely selective silicon etching and, on the other hand, allows an electrical connection between the polysilicon base terminal layer and the diffused extrinsic base terminal region. In addition, the etch stop layer thus is very thin so that the out-diffusion of the dopant, such as, e.g., of boron atoms, into the silicon substrate material is not impeded or restricted. By this, the substrate etching required up to now and the resulting impairment of the silicon substrate can be avoided in the emitter window etching to be performed when manufacturing a polysilicon bipolar transistor and, in particular, the base terminal structure of it.

The inventive provision of a thin etch stop layer can thus be applied to other semiconductor structures in the manufacture of which the following method steps are performed according to the invention. The inventive method of producing a semiconductor substrate includes the steps of applying an etch stop layer on a surface of a semiconductor substrate, producing a doped poly-crystal layer on the etch stop layer, etching the poly-crystal layer for producing a window in it, wherein the etch stop layer serves as an etch stop, and producing doped regions in the semiconductor substrate by out-diffusing doping atoms from the remaining poly-crystal layer through the etch stop layer into the semiconductor substrate.

BRIEF DESCRIPTION OF THE DRAWINGS

Preferred embodiments of the present invention will be detailed subsequently referring to the appendage drawings, in which:

FIGS. 1a–d show different method steps for manufacturing the base terminal structure of a polysilicon bipolar transistor according to the present invention;

DESCRIPTION OF THE PREFERRED EMBODIMENTS

Figure 2A:
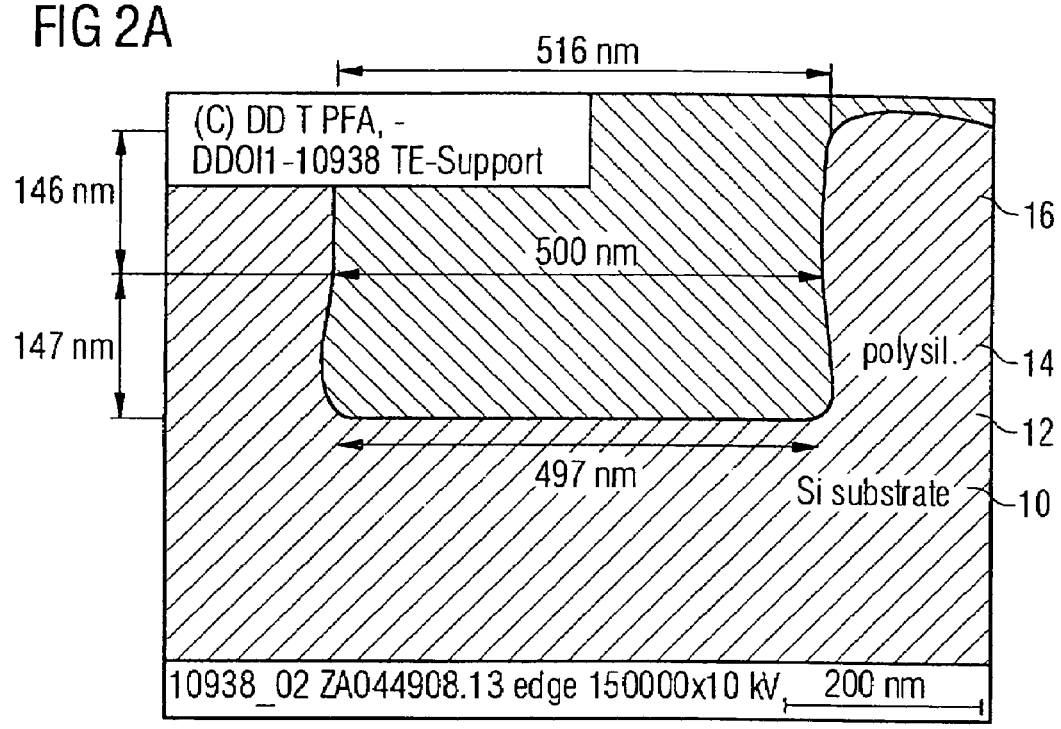
FIGS. 2a–b show recordings taken by electron microscopy of an emitter window and a base terminal structure, respectively, when inventively manufacturing a polysilicon bipolar transistor.

Referring to FIGS. 1a–d and 2a–b, a preferred embodiment of the present invention for manufacturing a polysilicon bipolar transistor having an implanted base and, in particular, for producing the base terminal structure of a polysilicon bipolar transistor will be discussed in detail. As is illustrated in FIG. 1a, a single-crystal silicon body serving as the silicon substrate 10 for a bipolar transistor is used preferably. A region of a first conductivity type is generally formed in the silicon substrate 10, wherein this region serves as the collector region of the bipolar transistor. Subsequently, an etch stop layer 12 is applied on the single-crystal semiconductor substrate (silicon substrate) 10, for example by means of deposition. A poly-crystal layer 14, such as, e.g., a polysilicon layer, of a second conductivity type is applied suitably on the etch stop layer 12, wherein this layer 14 subsequently will be referred to as the polysilicon base terminal layer. One or several layers 16 of a material, such as, e.g., a dielectric (insulating) material, are formed on the surface of the polysilicon base terminal layer 14 and on the additionally still exposed etch stop layer 12. In FIGS. 1a–1d, only one insulating layer is illustrated to simplify the description. It is to be kept in mind that the insulation layer (or insulation layers) provided in FIG. 1a is provided optionally since this is not an essential feature for the present invention.

Since undoped polysilicon layers are high-resistive (about $10^4$ ohm cm), the polysilicon base terminal layer 14 is provided with dopants, such as, e.g., boron, phosphorus or arsenic, in the present case, since this layer has an electrically conducting function in the transistor to obtain the respective doping type, the desired doping intensity and thus the desired electrical conductivity of the polysilicon base terminal layer 14.

In order to save an additional doping step, the doping of the polysilicon terminal layer 14 is generally achieved during the deposition of the polysilicon by adding suitable materials.

Instead of this in-situ doped polysilicon deposition, the doping of the polysilicon layer may also take place by means of implantation. Thus, in BiCMOS processes, a polysilicon deposition from the CMOS region is often made use of. This polysilicon material can thus generally only be doped by means of implantation.

In the present case, the polysilicon base terminal layer 14 is of the second conductivity type, wherein in the context of the present invention, the first conductivity type refers to a so-called n-type doping while the second conductivity type refers to a so-called p-type doping. Doping in a semiconductor material is referred to as n-type when the majority charge carriers therein are electrons, wherein doping in a semiconductor material is referred to as p-type when the majority charge carriers therein are holes. In the present invention, the conductivity types of the dopings can, however, also be selected the other way round.

For discussing further steps on the inventive method for manufacturing a base terminal structure for a polysilicon bipolar transistor, reference will now be made to FIGS. 1b and 1c.

As is illustrated in FIGS. 1b and 1c, the insulation layer 16 (FIG. 1b) and the polysilicon base terminal layer 14 are patterned to produce a so-called emitter window 24 when manufacturing a polysilicon bipolar transistor. The patterning of the respective layer usually takes place by means of dry etching the insulation layer 16 and the polysilicon base terminal layer 14 or by means of corresponding proceedings as regards process technology. As is illustrated in FIG. 1c, the etching process stops exactly at the etch stop layer 12 applied on the silicon substrate so that substrate etching required in the prior art need not take place.

In order for the etching process to end abruptly at the etch stop layer 12 over the silicon substrate 10, a very high etching selectivity between the polysilicon material of the polysilicon base terminal layer 14 and the material of the etch stop layer 12, such as, e.g., silicon oxide, is required.

A typical thickness range for the material of the etch stop layer, for example, is between 0.1 nm and 5 nm and preferably between 0.5 and 1.0 nm. A thermal oxide or a chemically grown oxide can, for example, be used as materials for the etch stop layer, wherein the usage of thermally grown nitride, for example, is also possible. A thermal oxide is generally produced by means of a low temperature oxidation in a furnace or in an RTA chamber (RTA=Rapid Thermal Annealing). A chemically grown oxide is, for example, produced by means of a so-called oxidative wet-clean treatment.

Thus, the oxide interface breaks up in temperature treatments around 900° C., which is how the contact resistance between the polysilicon of the base terminal layer 14 and the substrate silicon is decreased considerably and the doping atoms can in-diffuse into the silicon substrate 10 mostly unhindered. The thickness minimum of the etch stop layer is determined by the selectivity of the etching. In today's conventional etching processes, this minimum is, for example, in the range of 0.5 nm (and lower). The maximal thickness of the etch stop layer is determined by the etch stop layer still breaking up in the annealing process since it becomes too high-resistive otherwise. This is, for example, usually the case at around 1 nm (and more).

As an alternative to the etch stop layers discussed above, conductive etch stop layers which let dopant atoms, such as, e.g., boron atoms, diffuse through can be used in principle.

It is also to be kept in mind that even layers can be used which produce stress when tempered, as is, for example, the case in nitride, and thus favor the diffusion. It becomes obvious from the above discussion that apart from oxide, other materials, such as, e.g., nitride, may be used as the material for the etch stop layer.

The thickness of the etch stop layer thus, for example, is in a range from 0.1 nm to 5 nm, wherein the preferred thickness of the etch stop layer in the present invention is about 1 nm to obtain the physical features of the etch stop layer 12 discussed below. It is to be noted that the inventive thin etch stop layer 12 can be used both in fixed-time etching and in etching with endpoint detection to avoid etching the silicon material of the semiconductor substrate 10.

For discussing further process steps for manufacturing the base terminal structure for a polysilicon bipolar transistor, reference will now be made to FIG. 1d.

Subsequently, the etch stop layer 12 is removed in the region of the emitter window 24. In the region of the emitter window 24, there is thus a portion of the silicon substrate 10 comprising an extremely homogenous and planar surface. In the region of the emitter window 24 the "intrinsic" base region 18 of the polysilicon bipolar transistor is implanted in the silicon substrate 10.

It is, however, also possible to first implant the "intrinsic" base region 18 of the polysilicon bipolar transistor into the silicon substrate 10 through the thin etch stop layer 12 in the region of the emitter window 24 and to subsequently remove the etch stop layer 12 in the region of the emitter window 24.

In the present embodiment, the base region is doped with the second conductivity type.

In an ion implantation, the dopant is at first ionized in plasma. The charged particles are accelerated towards the surface of the silicon substrate 10 with voltages of typically 10 kV and typically penetrate into the silicon by 10 nm. Thus the silicon lattice is damaged and even the dopant atoms themselves are not at the lattice positions. In order to restore the single-crystal state and to position the dopant atoms at the lattice positions—in this context this is called electrical activation—a tempering at typically 900°–1000° C. is generally required.

Subsequently, a so-called "inner spacer" 20 is patterned in the region of the emitter window 18. An inner spacer is a structure formed along a step. Inner spacers which are, for example, made of an $SiO_2$ material, are used in silicon technology where structure edges are to be slightly offset in a lateral direction or where edges are to be insulated. In the present invention, the inner spacer 20 is used to produce self-aligned polysilicon base and emitter regions or contacts of the polysilicon bipolar transistor. The inner spacer 20 is provided to define, on the one hand, the size of the emitter region located above the base region in order to define the emitter terminals and, on the other hand, to insulate the emitter terminals electrically from the base terminal layer.

The present semiconductor structure is subjected to a temperature treatment (tempering) so that, due to the concentration gradient of the dopants between the highly doped polysilicon base terminal layer 14 and the single-crystal semiconductor body 10, at least some of the dopants out-diffuse from the highly doped polysilicon base terminal layer 14 into the single-crystal semiconductor body, i.e. into the silicon substrate 10. Thus, the base terminal region 22 forms in the silicon substrate 10, i.e. in particular adjacent to the polysilicon base terminal layer 14. Thus, at least some of the dopant atoms of the second conductivity type of the highly doped polysilicon base terminal layer 14 reach the silicon substrate 10 to produce the base terminal region 22 of the second conductivity type adjacent to the polysilicon terminal layer 14 in the silicon substrate 10. This region is also referred to as the extrinsic base terminal region 22.

Due to the small thickness of the etch stop layer 12, the dopant atoms can basically cross the etch stop layer 12 unhindered. The extrinsic base terminal region 22 thus, starting from the interface between the polysilicon base terminal layer 14 and the silicon substrate 10, extends laterally to the intrinsic base region 18 of the bipolar transistor, wherein a sufficient overlapping with the in-diffused extrinsic base terminal region preferably results in the edge region of the intrinsic base region. The result is a large-area electrical connection to the intrinsic base region 18 in the semiconductor substrate 10.

Temperature treatment or tempering, in silicon technology, is the treatment of silicon at high temperatures in an inert atmosphere, such as, e.g., nitrogen, argon, hydrogen, forming gas. Thus, new layers do not grow and the material is not removed but the layers already present and the silicon substrate itself are subjected to decisive changes. In the present case, the dopant atoms of the first and second conductivity type of the polysilicon base terminal layer 14 reach the adjacent single-crystal semiconductor material of the silicon substrate 10.

In addition, after ion implantation, such a temperature treatment can simultaneously be used to restore the single-crystal state of the silicon substrate 10 and to bring the dopant atoms to the lattice positions (annealing).

A base structure or a base terminal structure can consequently be produced by the inventive method of manufacturing a base terminal structure for a polysilicon bipolar transistor, which has a doped base terminal region 22 in a single-crystal semiconductor substrate 10 and a doped polycrystal base terminal layer 14 arranged on the doped base terminal region 22, wherein between the doped base terminal region 22 and the polysilicon base terminal region 14, an intermediate layer 12 is arranged which provides an electrically conductive connection between the doped base terminal region 22 and the polysilicon base terminal layer 14 and is made of a material which can be used as an etch stop for etching the polysilicon base terminal layer 14.

An emitter window 24 defining an exposed region of the single-crystal semiconductor structure 10 is formed in the poly-crystal base terminal layer. In this region of the emitter window 24, the base region 18 of a polysilicon bipolar transistor is formed by means of implantation. In addition, the base terminal region 22 is formed by out-diffusing dopant atoms from the polysilicon base terminal layer 14 through the intermediate layer 12 into the semiconductor substrate 10, wherein there is an electrically conductive connection between the polysilicon base terminal layer 14 and the base terminal region 22 and thus the implanted base region 18.

When manufacturing an electrically conductive connection between the polysilicon base terminal layer 14 and the base terminal region 22, only the inner spacer 20 has to be under-diffused in a lateral direction in the present invention, i.e. only about 70 nm–130 nm and preferably only about 90 nm–110 nm. A smaller base terminal resistance thus forms by a sufficient overlapping in the edge region of the intrinsic base region with an in-diffused extrinsic base terminal region. A relatively low temperature of about 800–1000° C. and preferably about 850–950° C. is sufficient in this diffusion process.

As has already been noted above, in the manufacturing method known from the prior art, in contrast to the present invention, the base anneal process must be performed at a considerably higher temperature of about 1050° C.–1100° C., since an in-diffusion of the dopant atoms of at least 150 nm and more in depth, i.e. into the silicon substrate, is required. This diffusion depth results from the fact that the substrate etching of about 40 nm and the spacer length of about 100–150 nm, including the etching rate variations in the etching depth, must be overcome in the diffusion process.

In summary, it can be noted that the present invention suggests providing a thin etch stop layer between the single-crystal silicon substrate material and the polysilicon base terminal layer, wherein the etch stop layer thus, on the one hand, makes possible an extremely selective silicon etching and, on the other hand, allows an electrical connection between the polysilicon base terminal layer and the diffused extrinsic base terminal region. The substrate etching in the emitter window etching required when manufacturing a polysilicon bipolar transistor and, in particular, the base terminal structure of it, is avoided by this. The etch stop layer is very thin so that, on the one hand, the out-diffusion of the dopant, such as, e.g., of boron atoms, into the silicon substrate material is not suppressed and, additionally, there is an electric conductivity between the polysilicon base terminal layer and the extrinsic diffused base terminal region after the out-diffusion.

In the inventive manufacturing method, a considerably lower temperature budget is thus sufficient to out-diffuse the extrinsic base terminal region and thus to produce the electrical connection between the base terminal layer and the intrinsic base region of the bipolar transistor. In addition, this scattering of the base terminal resistance is minimized, wherein additionally negative influences due to the roughness of the etched silicon substrate material are no longer present so that spurious substrate roughnesses are basically avoided which, in the extreme case, may result in an inhomogeneous interface in the emitter region or an inhomogeneous base width and thus an inhomogeneous current distribution in the bipolar transistor.

Figure 2B:
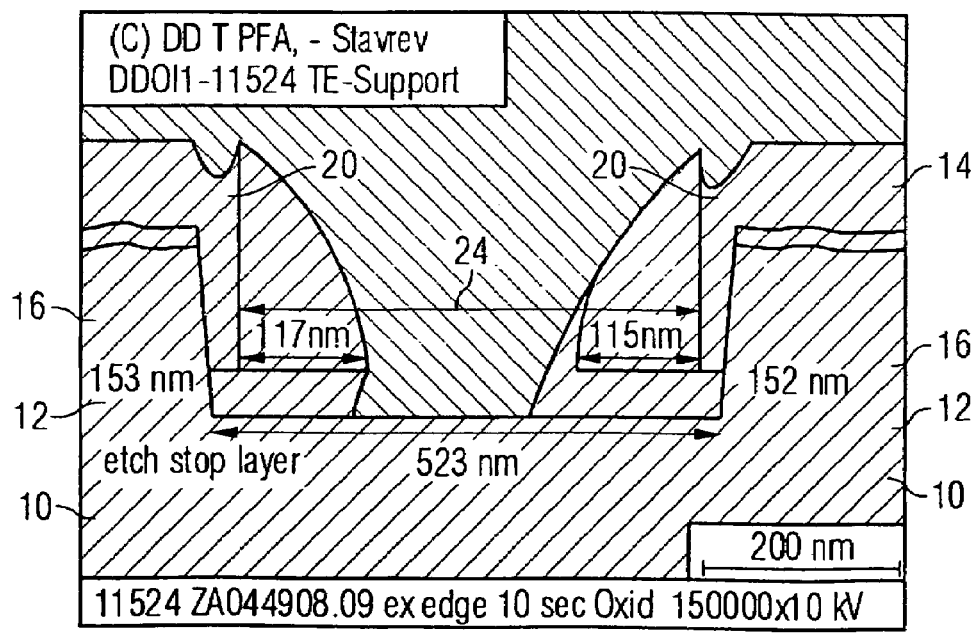
Figure 3:
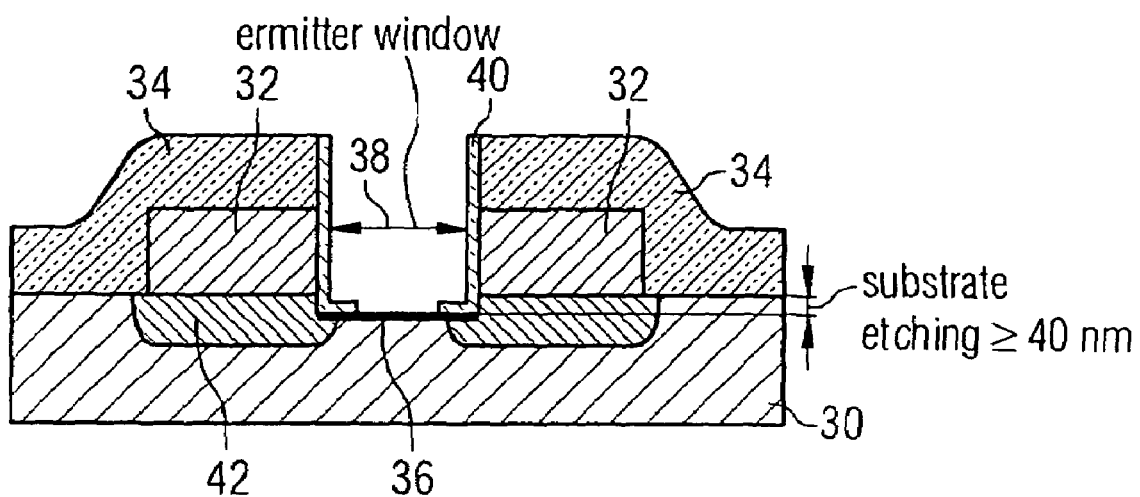
FIG. 3 shows a base terminal structure for a conventional polysilicon bipolar transistor according to the prior art.

For illustrating the present invention, FIGS. 2a–b illustrate recordings taken by electron microscopy of the emitter window and the base terminal structure, respectively, when manufacturing a polysilicon bipolar transistor. The respective dimensions of the different layers and structures are indicated in FIGS. 2a–b. In addition, FIG. 2b shows the presence of the oxide layer 12 serving as the stop layer between the polysilicon base terminal layer 14 and the semiconductor substrate 10.

As can be seen from FIG. 2b, the thickness of the etch stop layer 12 which, for example, consists of a thin silicon oxide layer, is about 1 nm. The emitter window etching is defined by means of this layer, i.e. stopped exactly at the substrate surface.

The relevant regions shown in FIG. 2b of the inventive base terminal structure for a polysilicon bipolar transistor, i.e. the single-crystal semiconductor substrate 10 (silicon substrate), the etch stop layer 12, the poly-crystal layer 14 (polysilicon), the insulation layer 16, the intrinsic base region 18, the inner spacer 20 and the emitter window 24, are provided with reference numbers used in the present invention for illustration.

While this invention has been described in terms of several preferred embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

What is claimed is:

1. A method of producing a base terminal structure for a bipolar transistor, the method comprising:

providing an etch stop layer on a single-crystal semiconductor substrate;

producing a poly-crystal base terminal layer on the etch stop layer;

etching an emitter window in the base terminal layer using the etch stop layer as an etch stop; and producing a doped base terminal region by out-diffusing dopant atoms from the poly-crystal base terminal layer through the etch stop layer into the semiconductor substrate, wherein the base terminal region has a depth between 70 nm and 130 nm, wherein the etch stop layer provides an electrically conductive connection between the doped base terminal region and the base terminal layer, and wherein the etch stop layer has a thickness of about 1 nm or less.

2. The method according to claim 1, wherein out-diffusing dopant atoms further comprises a temperature treatment at a temperature in a range between 800° and 1000° C.

3. The method according to claim 1, wherein out-diffusing dopant atoms further comprises a temperature treatment at a temperature in the range between 850° and 950° C.

4. The method according to claim 1, further comprising a step of removing the etch stop layer in the region of the emitter window and producing a base region by implantation in the region of the emitter window.

5. The method according to claim 1, wherein the thickness of the etch stop layer is in a range between 0.1 and 1 nm.

6. The method according to claim 1, wherein the thickness of the etch stop layer is substantially 1 nm.

7. The method according to claim 1, wherein the base terminal region has a depth between 90 nm and 110 nm.

8. A base terminal structure for a bipolar transistor, comprising:
a doped base terminal region in a single-crystal semiconductor substrate, wherein the base terminal region has a depth between 70 nm and 130 nm; and
a doped poly-crystal base terminal layer arranged on the doped base terminal region,
wherein an intermediate layer is disposed between the doped base terminal region and the base terminal layer, the intermediate layer providing an electrically conductive connection between the doped base terminal region and the base terminal layer, the intermediate layer formed of a material that is usable as an etch stop for etching the base terminal layer, and wherein the intermediate layer has a thickness of about 1 nm or less.

9. The base terminal structure according to claim 8, wherein the base terminal region has a depth between 90 nm and 110 nm.

10. The base terminal structure according to claim 8, wherein in the poly-crystal base terminal layer an emitter window is formed which defines an exposed region of the single-crystal semiconductor substrate.

11. The base terminal structure according to claim 8, wherein an implanted base region is formed in the region of the emitter window.

12. The base terminal structure according to claim 8, wherein the base terminal region is formed by out-diffusing dopant atoms from the base terminal layer through the intermediate layer into the semiconductor substrate, and wherein there is an electrically conductive connection between the base terminal layer and the base terminal region.

13. A method of producing a semiconductor structure, comprising the following steps:
providing an etch stop layer on a surface of a semiconductor substrate;
producing a doped poly-crystal layer on the etch stop layer;
etching the poly-crystal layer for producing a window therein, wherein the etch stop layer serves as an etch stop; and
producing doped regions in the semiconductor substrate by out-diffusing dopant atoms from the remaining poly-crystal layer through the etch stop layer into the semiconductor substrate, wherein the doped region has a depth between 70 nm and 130 nm, wherein the etch stop layer provides an electrically conductive connection between the doped regions in the semiconductor substrate and the remaining poly-crystal layer; and wherein the etch stop layer has a thickness of about 1 nm or less.

14. The method according to claim 13, wherein out-diffusing dopant atoms further comprises a temperature treatment at a temperature in a range between 800° and 1000° C.

15. The method according to claim 13, wherein out-diffusing dopant dopant atoms further comprises a temperature treatment at a temperature in the range between 850° and 950° C.

16. The method according to claim 13, further comprising a step of removing the etch stop layer in the region of the window and producing an implantation region by implantation in the region of the emitter window.

17. The method according to claim 13, wherein the thickness of the etch stop layer is in a range between 0.1 and 1 nm.

18. The method according to claim 13, wherein the thickness of the etch stop layer is substantially 1 nm.

19. The method according to claim 13, wherein the doped region has a depth between 90 nm and 110 nm.

20. The method according to claim 14, wherein the doped region has a depth between 90 nm and 110 nm.

* * * * *